(12) United States Patent
Nagase et al.

(10) Patent No.: US 8,492,659 B2
(45) Date of Patent: Jul. 23, 2013

(54) PRINTED WIRING BOARD AND MANUFACTURING METHOD THEREFOR

(75) Inventors: Kenji Nagase, Tokyo (JP); Hiroyuki Uematsu, Tokyo (JP); Kenichi Kawabata, Tokyo (JP)

(73) Assignee: TDK Corporation, Tokyo (JP)

( * ) Notice: Subject to any disclaimer, the term of this patent is extended or adjusted under 35 U.S.C. 154(b) by 526 days.

(21) Appl. No.: 12/379,295

(22) Filed: Feb. 18, 2009

(65) Prior Publication Data

US 2009/0211799 A1 Aug. 27, 2009

(30) Foreign Application Priority Data

Feb. 22, 2008 (JP) ................... 2008-042062

(51) Int. Cl.
*H05K 1/11* (2006.01)
(52) U.S. Cl.
USPC .......................... 174/266; 174/262
(58) Field of Classification Search
USPC ................. 174/250, 255, 262, 266; 29/825, 29/829, 846
See application file for complete search history.

(56) References Cited

U.S. PATENT DOCUMENTS

| | | | |
|---|---|---|---|
| 4,980,270 A | 12/1990 | Inasaka | |
| 6,326,559 B1 | 12/2001 | Yoshioka et al. | |
| 2003/0136578 A1 | 7/2003 | Kishimoto et al. | |
| 2003/0188888 A1 | 10/2003 | Yoshioka et al. | |

FOREIGN PATENT DOCUMENTS

| | | | |
|---|---|---|---|
| CN | 1466861 A | | 1/2004 |
| EP | 0 740 497 A1 | | 10/1996 |
| JP | 05082969 A | * | 4/1993 |
| JP | 05226423 A | * | 9/1993 |
| JP | A-09-321432 | | 12/1997 |
| JP | A-09-331155 | | 12/1997 |
| JP | A-2000-022337 | | 1/2000 |
| JP | A-2000-124615 | | 4/2000 |
| JP | 2001144442 A | * | 5/2001 |
| JP | A-2001-239386 | | 9/2001 |
| JP | A-2002-141626 | | 5/2002 |
| JP | 2003069176 A | * | 3/2003 |
| JP | A-2003-179351 | | 6/2003 |
| JP | 2003197811 A | * | 7/2003 |

OTHER PUBLICATIONS

Summons to attend oral proceedings pursuant to rule 115(1) issued in European Patent Application No. 09002358.1 dated Jun. 9, 2011.

* cited by examiner

*Primary Examiner* — Ishwarbhai Patel
(74) *Attorney, Agent, or Firm* — Oliff & Berridge, PLC

(57) ABSTRACT

The present invention provides a printed wiring board which can prevent a plating failure in a connection hole such as a via to be formed in the printed wiring board, thereby can enhance the connection reliability and a manufacturing method therefor. The printed wiring board 100 includes a thermosetting resin sheet 16 (insulation layer) having a via hole 20 (through hole) constituted by inner wall parts having different taper angles from each other, a copper foil 17 (conductor layer) provided on the thermosetting resin sheet 16, and a wiring pattern 13 (wiring layer) which is provided so as to be exposed from the via hole 20 and is electrically connected with the copper foil 17 through the via hole 20.

6 Claims, 9 Drawing Sheets

PRINTED WIRING BOARD AND MANUFACTURING METHOD THEREFOR

BACKGROUND OF THE INVENTION

1. Field of the Invention

The present invention relates to a printed wiring board and manufacturing method therefor, and particularly relates to a wiring method in a multilayer printed wiring board.

2. Description of the Related Art

As for a conventional high-density packaging structure of a printed wiring (circuit) board, a module or a packaging structure is known which uses a printed wiring board in a multilayer structure having a conductor layer and an insulation layer alternately stacked thereon, and has an active component such as a semiconductor IC chip (bear chip or die) or a passive component such as a resistor and a capacitor embedded therein. Such a multilayer structure generally has connection holes such as a via hole and a contact hole formed in between interlayers, and these connection holes are used to electrically connect a conductor layer with an electrode of the embedded electronic component provided in different layers.

For instance, Japanese Patent Laid-Open No. 2003-179351 describes a wiring method for connecting an upper conductor layer with a lower conductor layer, in a multilayer substrate including an insulation layer, an upper conductor layer and a lower conductor layer, the upper and lower layers respectively provided on the upper part and the lower part of the insulation layer, by the steps of: forming an aperture having the same shape and size as those of a spot of an irradiating laser beam on the upper conductor layer; irradiating the insulation layer with the laser beam by using an aperture pattern of the upper conductor layer as a mask (conformal mask); piercing a via so as to expose the lower conductor layer to be a wiring body from the insulation layer; and forming a conformal plated layer in the inner part of the via and on the upper conductor layer. Japanese Patent Laid-Open No. 2003-179351 also describes a copper direct method for forming a via through both the insulation layer and a copper foil as a method of using no mask. Japanese Patent Laid-Open No. 2001-239386 describes a general method of forming a via in a printed wiring board by irradiating a copper-clad laminate made up of a base material affixed with a copper foil with a carbon dioxide laser to form a hole toward the base material from above the copper foil.

In the above described conventional wiring method involving via forming, however, because of a steep angle defined by the surface of the lower conductor layer (land) formed in the bottom of the opened via and the inner wall surface of the via, it would be difficult to sufficiently secure the thickness of the plated film in the periphery of the opening of the via (angle in the upper part of the via) when the inner part of the via is plated, which causes a plating failure in the portion, and as a result, may cause a lowered reliability in the connection between the bottom wall (land) of the via to be a wiring body and the upper conductor layer.

As a result of various investigations, the present inventors confirmed that a plated film has less adhesion in the periphery of the opening in the upper part of the via than other parts, and that the plated film tends to become locally and excessively thin in the portion, for instance, in a method of forming a pattern of a conductor layer with an aperture having a size equal to or smaller than a diameter of an irradiating laser beam on the insulation layer, and irradiating the insulation layer with a laser having a beam diameter equal to or larger than the aperture through the conformal mask to form a via, as in a conformal mask method described in Japanese Patent Laid-Open No. 2003-179351, and also in a method of forming an aperture having a larger size than the beam diameter of the laser in the conductor layer and irradiating the conductor layer with the laser beam to form a via.

In recent years, in particular, a terminal pitch and a wiring pitch of components in a printed circuit board have rapidly been narrowed (fine pitched) so as to respond to the demand for higher packaging density, and as a result, the via has progressively been made to have a higher aspect ratio. In addition, it is an urgent task to thin the plated film itself, so that the lowered connection reliability due to a plating failure in the via will be more serious problem in the future. A module and a package having an electronic component such as a semiconductor IC chip mounted thereon particularly have a great number of the vias, so that it is an extremely important challenge to secure the connection reliability for 100% of vias, in order to secure and keep the product reliability.

The copper direct method of forming a via penetrating both the insulation layer and the copper foil as disclosed in Japanese Patent Laid-Open No. 2003-179351 and the method of forming the via by irradiating the conductor layer with a laser to penetrate both the insulation layer and the conductor layer without forming a mask by patterning the upper conductor layer as disclosed in Japanese Patent Laid-Open No. 2001-239386 are not much different in that it is difficult to sufficiently secure the thickness of a plated film in the periphery of the opening of the via when plating the via afterward. Moreover, Japanese Patent Laid-Open No. 2001-239386 describes that the method calls for removal of a burr in a copper foil formed in the periphery of the pierced via, with a wet etching technique, so that in this regard, the method has a problem in securing the connection reliability.

Thus, the present invention has been made in view of such circumstances, and is directed to providing a printed wiring board in which a plating failure can be prevented in a connection hole such as a via to be formed in the printed wiring board, thereby can enhance the connection reliability and can sufficiently cope with the trend of finer pitches, and providing a manufacturing method therefor.

SUMMARY OF THE INVENTION

A printed wiring board according to the present invention includes an insulation (insulative) layer having a through hole, a conductor (conductive) layer provided on the insulation layer, and a wiring layer which is provided so as to be exposed from the through hole and is electrically connected to the conductor layer via the through hole, wherein the through hole has a first inner wall part contacting with the wiring layer and a second inner wall part contacting with the conductor layer, and a taper angle in at least one part of a portion contacting with the conductor layer in the second inner wall part is larger than a taper angle of the first inner wall part. The wiring layer and the conductor layer do not necessarily need to have a layered shape. One or both of the wiring layer and the conductor layer may be, for instance, a wiring body such as an electrode and a terminal.

In other words, in the printed wiring board of the present invention, the through hole has the first inner wall part contacting with the wiring layer and the second inner wall part contacting with the conductor layer, and an inner angle defined (formed) by an extended plane of the conductor layer or the wiring layer and at least one part of a portion contacting with the conductor layer in the second inner wall part is made to be smaller than the inner angle defined (formed) by the extended plane of the conductor layer or the wiring layer and the first inner wall part.

In thus configured printed wiring board, the conductor layer provided on one side (face) of the insulation layer is connected with the wiring layer provided on the other side (face) of the insulation layer via (through) a through hole formed in the insulation layer, and thereby the both layers are brought into conduction. This through hole has the first inner wall part and the second inner wall part. A taper angle of the second inner wall part connecting to the wiring layer, in other words, the taper angle of a portion contacting with at least the conductor layer out of portions including an open end of the through hole is made larger than that of the first inner wall part connecting to the wiring layer positioned in the lower part than the conductor layer, and the gradient in the periphery of the opening of the through hole is milder than that of the bottom part. In other words, the diameter of at least a portion contacting with the conductor layer out of the second inner wall part including the open end of the through hole is gradually widened toward the open end from the inner part, so that when the conductor layer, the inner part of the through hole and the wiring layer exposed from the insulation layer at the bottom are plated, the plated film in the portion contacting with at least the conductor layer in the periphery of the opening of the through hole acquires sufficient thickness compared to that in a conventional through hole which does not have the second inner wall part.

The shape of the wall surface of the second inner wall part contacting with the conductor layer is not particularly limited, but includes, for instance, a flat surface, a concave surface, a convex surface and a convexo-concave surface. It is preferable that among these surfaces, at least one part of the wall surface in the portion contacting with the conductor layer in the second inner wall part has a concave shape. The second inner wall part inclines at a predetermined taper angle. At this time, when at least one part of the wall surface in a portion contacting with the conductor layer in the second inner wall part has a concave shape (in other words, concave surface), the above described portion retains an increased amount of a plated film thereon, and makes the plated film easily and further sufficiently thick, which is advantageous.

A method for manufacturing a printed wiring board according to the present invention is a process of effectively manufacturing the printed wiring board according to the present invention, and is a method for manufacturing a printed wiring board in which a conductor layer provided on one side (face) of the insulation layer is electrically connected with a wiring layer provided on other side (face) of the insulation layer via a through hole formed on the insulation layer, including the steps of: forming a conductor layer having an aperture on the insulation layer; forming a hole having a smaller size than that of the aperture (hole having dimension included within region of aperture) in a portion corresponding to the aperture in the insulation layer; forming a through hole for connecting the conductor layer with the wiring layer in a portion corresponding to the hole in the insulation layer while using the conductor layer having the aperture as a mask; and forming a plated film in the inner part of the through hole and on the conductor layer to electrically connect the conductor layer with the wiring layer (plating in the inner part of the through hole and on the conductor layer to electrically connect the conductor layer with the wiring layer).

Alternatively, a method for manufacturing a printed wiring board according to the present invention may include the steps of: forming a hole in an insulation layer; forming a mask having an aperture having a larger size than that of the hole (aperture having dimension including hole in the region of the aperture) on the insulation layer or in the upper part of the insulation layer; forming a through hole for connecting a conductor layer with a wiring layer in a portion corresponding to the hole in the insulation layer with the use of the mask; and forming a plated film in the inner part of the through hole and on the insulation layer to form the conductor layer and also electrically connect the conductor layer with the wiring layer. Such a method can employ an appropriate mask placed on the insulation layer or in the upper part of the insulation layer so as to form a through hole. The mask may closely contact with the insulation layer or may not. The mask is removed or retracted from above the insulation layer before the inner part of the through hole and the insulation layer are subjected to plating. In addition, the plating layer is integrally formed in the inner part of the through hole and on the insulation layer by subjecting the inner part of the through hole and the insulation layer to plating. Then, a portion of the plated layer on the insulation layer in the whole plated film functions as the conductor layer.

In addition, a method for manufacturing a printed wiring board according to the present invention may include the steps of: forming a hole in an insulation layer; forming a conductor layer having an aperture having a larger size than that of the hole (aperture having a dimension including hole in the region of the aperture) in a portion corresponding to the hole; forming a through hole for connecting the conductor layer with a wiring layer in a portion corresponding to the hole in the insulation layer while using the conductor layer having the aperture as a mask; and forming a plated film in the inner part of the through hole and on the conductor layer to electrically connect the conductor layer with the wiring layer. In other words, the method for manufacturing the printed wiring board according to the present invention may conduct any of the step of forming the hole in the insulation layer and the step of forming the conductor layer having the aperture in the insulation layer previously.

In the step of forming the hole in the insulation layer in a method for manufacturing the printed wiring board according to the present invention, the hole may be a through hole or a non-through hole. In the case of the through hole, when the through hole is formed, the wiring layer can be exposed from the insulation layer at the bottom. On the other hand, in the case of the non-through hole, the wiring layer is exposed from the through hole at the bottom of the insulation layer, in the step in which the through hole is formed in the insulation layer. In any case, after the step of forming the through hole in the insulation layer has been conducted, a through hole having a shape for connecting the conductor layer with the wiring layer is formed which is, in other words, a through hole having the first inner wall part and the second inner wall part provided on the above described printed wiring board according to the present invention.

More specifically, in the step of forming the through hole, the through hole is formed preferably so that a taper face is formed at least in one part of a portion contacting with the conductor layer in the edge portion of the aperture of the hole (portion including open end of hole) which has been formed in the step of forming the hole. Thereby, the second inner wall part of the through hole is surely formed.

In addition, in the step of forming the through hole, it is preferable to grind the insulation layer at a smaller grinding rate than a grinding rate (ground amount of insulation layer per unit time) for the insulation layer when forming the hole in a step of forming the hole and thereby form the through hole. By doing this, the edge of aperture is chamfered so that a taper face is formed in a portion including the open end of the hole (edge of aperture), so that the second inner wall part of the through hole is more easily formed.

In this case, more specifically, it is preferable to form the hole by irradiation with a laser in a step of forming the hole in the insulation layer, and to form the through hole with blast treatment (of any of wet type and dry type) in a step of forming the through hole in the insulation layer. By doing this, a portion having a fine and steep wall shape corresponding to the first inner wall part of the through hole can be easily formed only by irradiation with a laser, or by complex treatment of irradiation with a laser and blast treatment. In addition, the edge of the aperture is chamfered so that a taper face can be formed in a portion including the open end of the hole (edge of aperture), because a grinding rate by the blast treatment for the insulation layer is generally smaller than that by the laser irradiation. Accordingly, the blast treatment makes the second inner wall part remarkably and more surely formed in the through hole.

However, in place of the blast treatment (blasting), desmear treatment (desmearing), plasma (ashing) treatment, jet scrub treatment (jet scrubbing), ultrasonic treatment, laser treatment, drill working (drilling) or the like may be employed, though it depends on a shape required for material properties of the insulation layer and the through hole. In addition, in the step of forming the hole and the step of forming the through hole, the same type of treatment may be performed. In this case, the grinding rate for the insulation layer in the step of forming the through hole may be made smaller than that for the insulation layer in the step of forming the hole, as was described above. For instance, in the case of performing the both steps by laser irradiation treatment, the irradiation energy density of the laser in the step of forming the through hole may be made smaller than that in the step of forming the hole. An example for doing this is a method of equalizing the irradiation energy of the laser in both steps and making the diameter of the laser beam in the step of forming the through hole larger by defocusing the laser beam or by a similar technique.

In a printed wiring board and the manufacturing method therefor according to the present invention, a conductor layer is connected with a wiring layer via a through hole which has been pierced in an insulation layer, and the through hole has a first inner wall part having a relatively small taper angle and a second inner wall part having a relatively large taper angle. Thereby, when the wiring layer and the inner part of the through hole are plated, the plated film in a portion contacting at least with the conductor layer in the periphery of the opening of the through hole is formed sufficiently thicker than that in the portion of a conventional through hole which does not have the second inner wall part. Thus, the manufacturing method can prevent the plated film from being locally thinned, accordingly can enhance the reliability of the connection between the wiring layer and the conductor layer, even though a via has a higher aspect ratio than that in the conventional film, further can previously set the whole plated film thickness at a small value, consequently, can sufficiently cope with the trend of finer pitches and by extension of higher density packaging, and can further enhance the product reliability.

DETAILED DESCRIPTION OF THE PREFERRED EMBODIMENTS

Embodiments according to the present invention will now be described below with reference to the drawings. In the drawings, the same reference numerals will be put on the same elements, and overlapping descriptions will be omitted. A positional relation such as up, down, left and right may be based on the positional relation as is illustrated in the drawings, unless otherwise specifically indicated. A dimensional ratio in the drawings is not limited to the shown ratio. The following embodiments are illustrated for describing the present invention, and the present invention is not limited to the embodiments. Furthermore, the present invention can be modified in various ways insofar as they do not deviate from the scope of the invention.

FIG. 1 to FIG. 8 are process drawings (flow chart) for showing steps of manufacturing preferred one embodiment of a printed wiring board according to the present invention, which are schematic sectional views for illustrating an essential part of the printed wiring board in each step. The method for manufacturing the printed circuit board according to the present embodiment can be applied to various cases of manufacturing the printed wiring board, for instance, to the case of mounting electronic components of active components such as a semiconductor IC chip and passive components such as a resistance and a capacitor on a core substrate constituting a base material of a substrate module which embeds them therein, to the case of mounting the electronic components on a so-called buildup layer to be formed on a core substrate, and the like.

Figure 1:
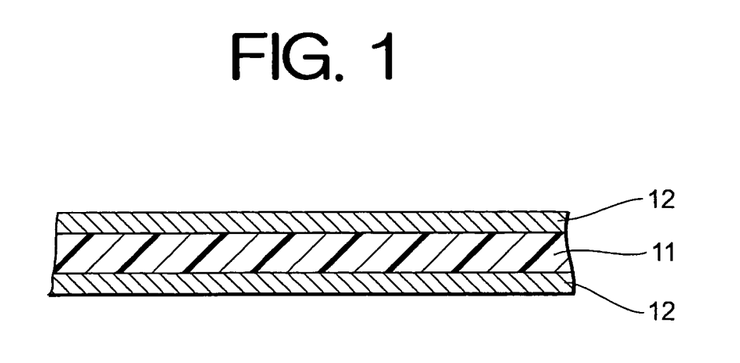
FIG. 1 is a process drawing for showing steps of manufacturing preferred one embodiment of a printed wiring board according to the present invention.

In the present embodiment, firstly, a core substrate 11 is prepared (FIG. 1). The core substrate 11 plays a vital role in securing a mechanical strength of the whole printed wiring board, is not particularly limited, but can employ, for instance, a resin substrate provided with copper foils on its both faces. The material of the resin substrate is not particularly limited, and can employ a material of making a thermosetting resin or a thermoplastic resin impregnated in a core material made from a glass cloth, a resin cloth of kevlar, aramid and a liquid crystal polymer, or a porous sheet of a fluorine resin, or the like. In addition, the material preferably has a thickness of approximately 20 μm to 200 μm. In order to uniformize the working condition, a sheet material excluding a core material such as LCP, PPS, PES, PEEK and PI may be employed as well.

On the other hand, a copper foil 12 preferably has a thickness of approximately 1 μm to 18 μm, for instance. An electrolytic copper foil (made by dissolving and ionizing copper into an aqueous solution of copper sulfate, and continuously electrodepositing the copper to form the copper foil while using an electrodeposition roll), which is used for a printed circuit board, or a rolled copper foil is preferably employed as the copper foil 12. It is because the variation of the thickness can be extremely diminished. The thickness of the copper foil 12 may also be adjusted by a technique of sweeping or the like, as needed.

Figure 2:
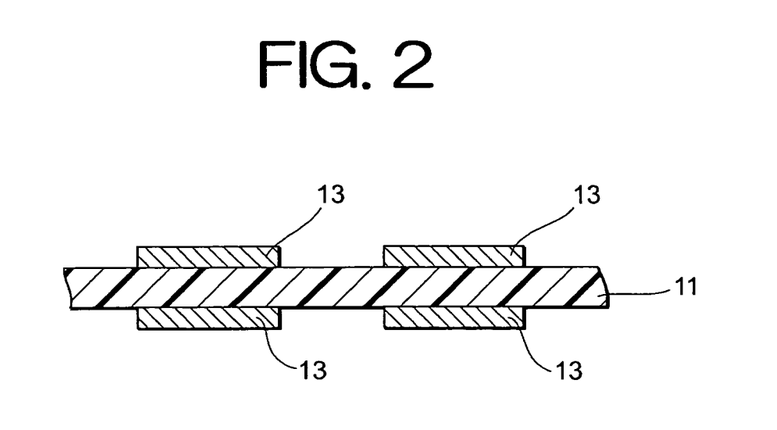
FIG. 2 is a process drawing for showing steps of manufacturing preferred one embodiment of a printed wiring board according to the present invention.

Subsequently, the copper foil 12 provided on both faces of the core substrate 11 is patterned by selectively removing the copper foil with a photolithographic technology and an etching technique, and a wiring pattern 13 (wiring layer) including electric wiring and a land is formed on the core substrate 11 (FIG. 2). At this time, the copper foil 12 in a predetermined region on the core substrate 11 is wholly removed although it is not shown, and a region for mounting electronic components thereon is thereby secured. Subsequently, the electronic components are mounted on the predetermined region. For instance, a semiconductor IC chip is mounted on the predetermined region of the core substrate 11 in a face up state (state in which pad faces to outside of core substrate 11). At this time, it is preferred to temporarily fix the semiconductor IC chip on the core substrate 11 with the use of an adhesive or the like.

Figure 3:
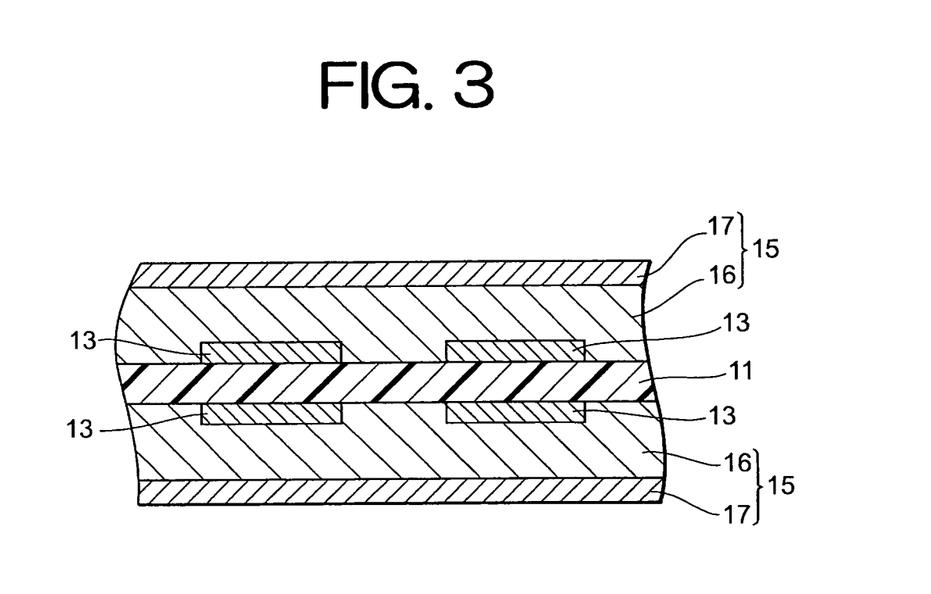
FIG. 3 is a process drawing for showing steps of manufacturing preferred one embodiment of a printed wiring board according to the present invention.

Subsequently, resin sheets 15 each provided with a copper foil on one side are laminated on both sides of the core substrate 11 (FIG. 3). The resin sheet 15 provided with the copper foil on one side is formed by affixing a copper foil 17 on one side of a thermosetting resin sheet 16 made from an epoxy resin or the like. Such resin sheets 15 provided with the copper foil on one side are integrated with the core substrate 11, by the steps of preparing two pieces of the resin sheets 15 provided with the copper foil on one side, laminating the resin surfaces on both sides of the core substrate 11 respectively, and hot-pressing the substrate and the sheets. Thereby, the electronic components such as the semiconductor IC chip, which have been previously mounted on the core substrate 11 are embedded in the printed wiring board, and the thermosetting resin sheet 16 and the copper foil 17 are formed into an insulation layer and a conductor layer of a buildup layer respectively.

Figure 4:
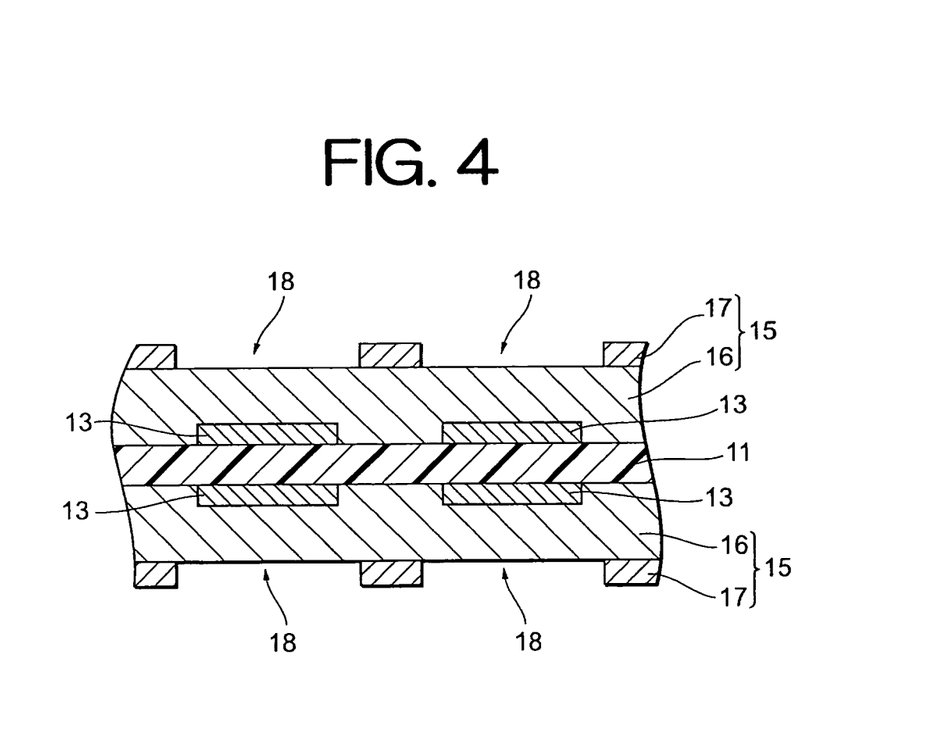
FIG. 4 is a process drawing for showing steps of manufacturing preferred one embodiment of a printed wiring board according to the present invention.

Subsequently, a mask pattern having an aperture 18 for forming a via hole therefrom later is formed in the copper foil 17 on the thermosetting resin sheet 16, by patterning the copper foil 17 through selectively removing copper with a photolithographic technology and an etching technique (FIG. 4). The diameter of the patterned aperture is not particularly limited, but is preferably set at approximately 30 μm to 200 μm, for instance.

Figure 5:
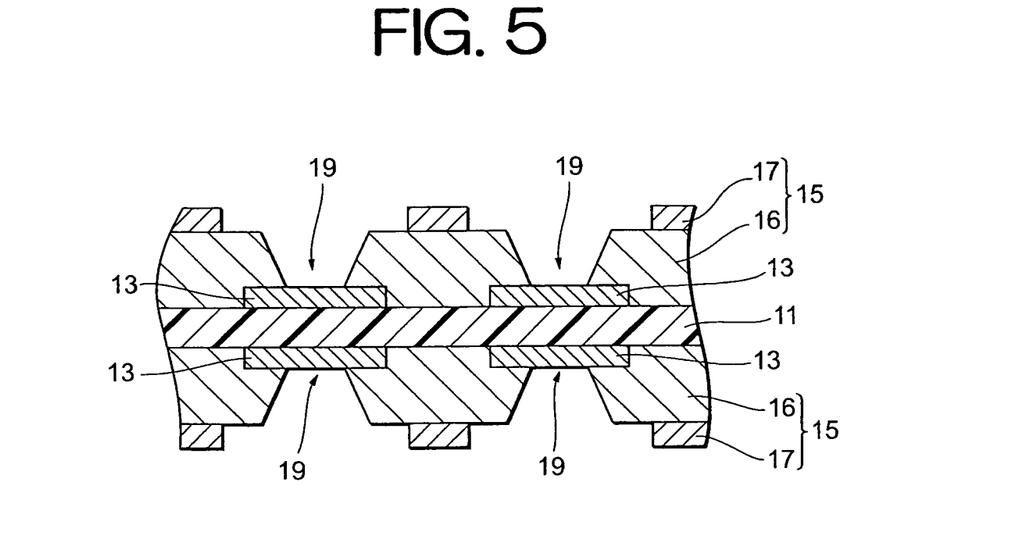
FIG. 5 is a process drawing for showing steps of manufacturing preferred one embodiment of a printed wiring board according to the present invention.

Subsequently, a predetermined position in a region corresponding to the aperture 18 in the thermosetting resin sheet 16 is irradiated with a laser having a smaller beam diameter than the diameter of the aperture 18 in the patterned copper foil 17, and a hole 19 is formed in the thermosetting resin sheet 16 (FIG. 5). The hole 19 is formed so as to penetrate the thermosetting resin sheet 16, and thereby, a wiring pattern 13 of a wiring body is exposed from an insulation layer at the bottom, which is the thermosetting resin sheet 16. The type of the laser to be used here is not particularly limited, and includes, for instance, a gas laser such as a high-power carbon dioxide laser, because the thermosetting resin sheet 16 has superior working characteristics. In some cases, a solid laser can also be used. The energy of the irradiated laser is absorbed in the thermosetting resin sheet 16. The irradiated portion of the thermosetting resin sheet 16 burns due to the heat, and the hole 19 protruding downward in the figure is formed therein as is schematically illustrated in FIG. 5.

Figure 6:
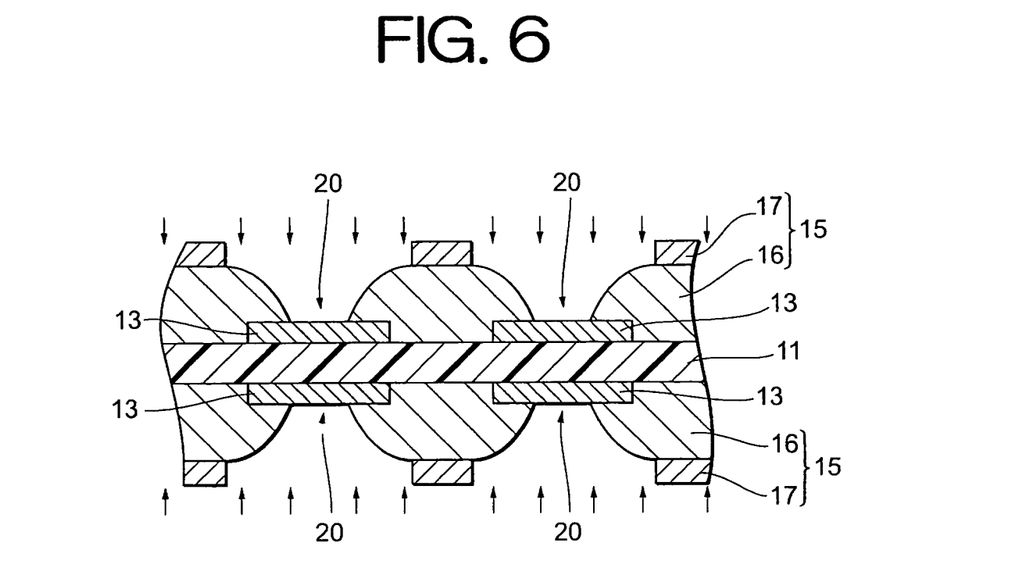
FIG. 6 is a process drawing for showing steps of manufacturing preferred one embodiment of a printed wiring board according to the present invention.

Furthermore, a via hole 20 is formed on the core substrate 11 having the hole 19 formed thereon, by the steps of subjecting the core substrate 11 to blast treatment such as alumina wet blast treatment and sand blast treatment while using the copper foil 17 in which the aperture 18 has been formed by patterning as a mask, and thereby chamfering the corner of the open end (edge of aperture) of the hole 19 (FIG. 6). In this blast treatment, the thermosetting resin sheet 16 of a body to be worked is ground by being projected with a non-metal particle or a metal particle of a medium. The grinding rate for the thermosetting resin sheet 16 at this time is generally smaller than that by a laser irradiation for forming the hole 19 for the thermosetting resin sheet 16, so that the progressing condition of grinding toward a depth direction of the hole 19 (so to speak, anisotropy of grinding) is alleviated and suppressed compared to that of the laser irradiation, and thereby the edge of the aperture of the hole 19 can be easily chamfered. In addition, a wiring pattern 13 exposed from the hole 19 of the thermosetting resin sheet 16 functions as a stopper, at this time.

The wiring pattern 13 forms the bottom wall of the via hole 20, so that the via hole 20 is a non-through hole in this state. However, the via hole 20 penetrates the layer of the thermosetting resin sheet 16 which is an insulation layer, and accordingly corresponds to a "through hole" described in claims in the present invention.

Next, a primary conductor layer (not shown) is formed almost all over the exposed surface including the inner wall surface of the via hole 20. An electroless plating method is preferably employed as a method for forming the primary conductor layer, but a sputtering method, a vapor deposition method or the like can also be employed. The primary conductor layer plays a role of a primer for the electrolytic plating which will be conducted later, and accordingly may be extremely thin. For instance, the thickness may be appropriately selected in a range of several tens of nanometers to several micrometers. Subsequently, a plated film 21 (including primary conductor layer) is formed almost all over the exposed surface including the inner wall surface in the via hole 20 (FIG. 7), by growing the primary conductor layer with an electrolytic plating method.

Figure 8:
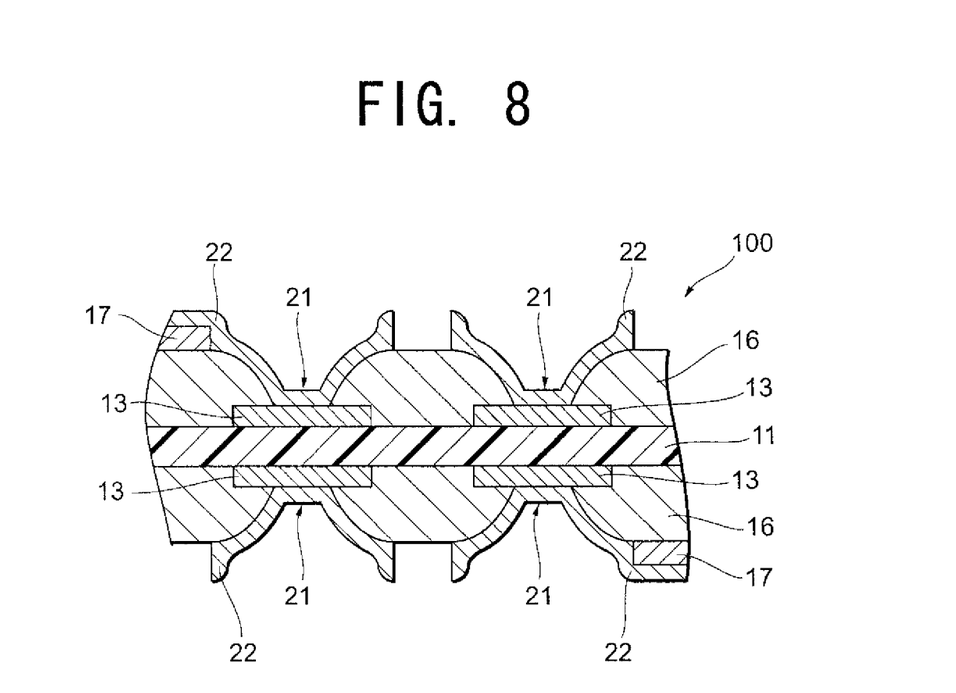
FIG. 8 is a process drawing for showing steps of manufacturing preferred one embodiment of a printed wiring board according to the present invention.

Then, a conductor pattern 22 including electric wires and lands is formed in a surface layer (external layer) by patterning the plated film 21 through selectively removing the plated film with a photolithographic technology and an etching technique. In this way, a printed wiring board 100 according to the present invention is obtained, which includes a thermosetting resin sheet 16 having the via hole 20, a copper foil 17 provided on the thermosetting resin sheet 16, and the wiring pattern 13 which is provided so as to be exposed from the via hole 20 and is electrically connected with the copper foil 17 through the via hole 20, wherein the via hole 20 is constituted by inner wall parts having different taper angles from each other (FIG. 8).

Figure 7:
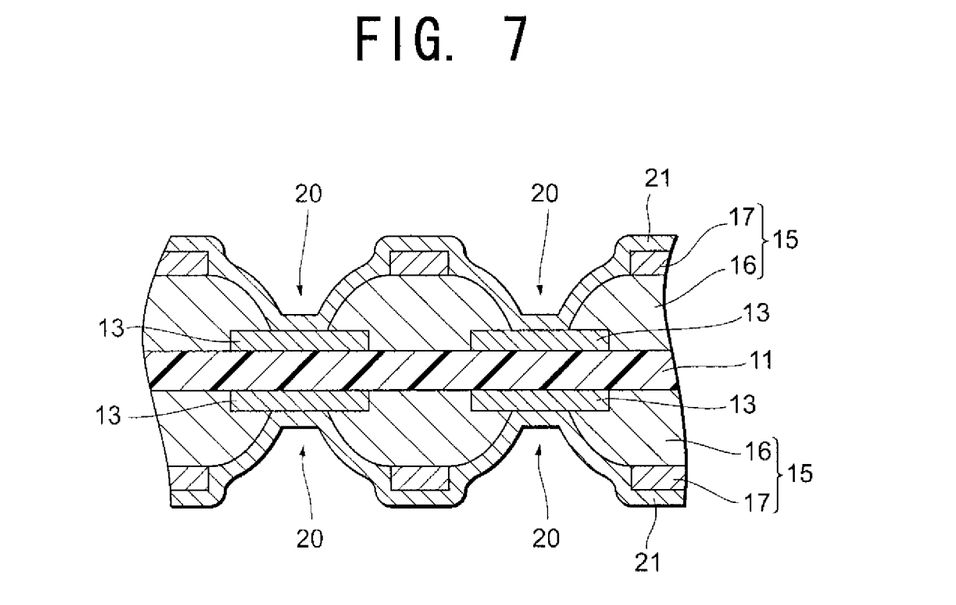
FIG. 7 is a process drawing for showing steps of manufacturing preferred one embodiment of a printed wiring board according to the present invention.

Here, FIG. 9 to FIG. 12 are schematic sectional views for schematically illustrating an essential part of a printed wiring board in a state illustrated in FIG. 7, and views for illustrating various embodiments of the via hole 20.

Figure 9:
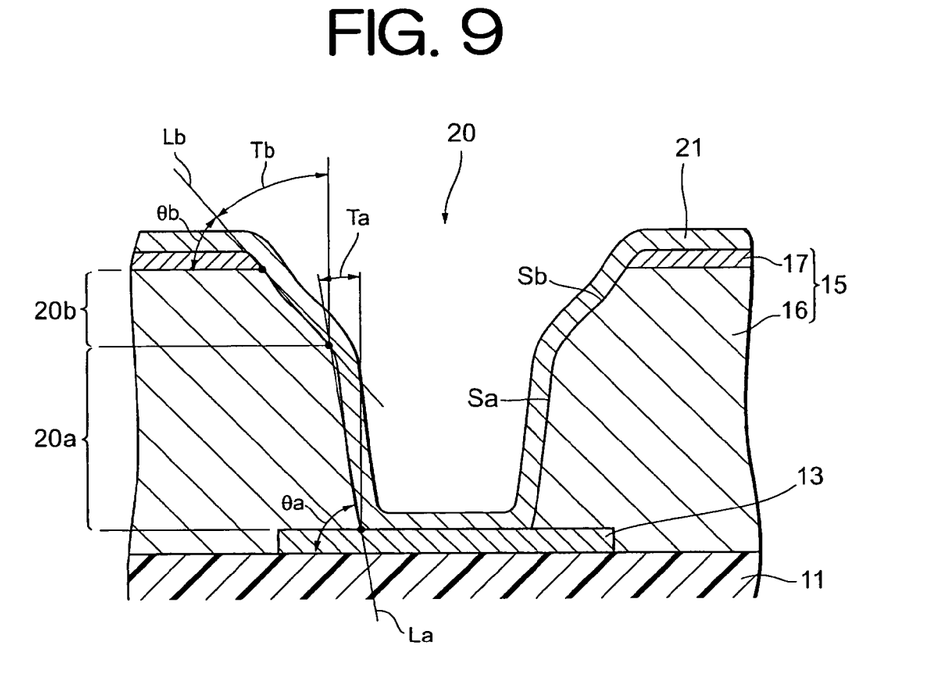
FIG. 9 is a schematic sectional view for schematically illustrating an essential part of a printed wiring board in a state illustrated in FIG. 7.

The via holes 20 illustrated in FIG. 9 are sectioned into an inner wall part 20a (first inner wall part) of which the lower end contacts with the wiring pattern 13 and an inner wall part 20b (second inner wall part) of which the upper end contacts with the copper foil 17. In other words, the via hole 20 is constituted by the inner wall parts 20a and 20b. In this embodiment, a wall surface Sa of the inner wall part 20a is formed to have a taper face which extends linearly and relatively steeply in the upper direction in the figure from the lower end in the figure while widening its diameter. On the other hand, the wall surface Sb of the inner wall part 20b is formed to have a taper face which curvilinearly and relatively mildly extends in the upper direction in the figure while being slightly recessed (so as to form a concave shape, conversely, to form a convex state in lower direction in figure) while widening its diameter. In other words, the via hole 20 includes the two-stage wall surface having different taper angles. The inner wall part 20b has a larger taper angle than the inner wall part 20a, and has an alleviated gradient on the whole.

Here, "taper angle" means angles Ta and Tb (hereinafter referred to as "taper angles Ta and Tb") formed by virtual lines La and Lb which connect both ends (parts) in each of the inner wall parts 20a and 20b with a straight line and a line in a direction perpendicular to the printed wiring board, in a cross section perpendicular to the printed wiring board, and in other words, a wholly (average) widening angle of the taper (face) of the inner wall parts 20a and 20b. The both ends of the inner wall part 20a show the shown lower end of the inner wall part 20a (contact point with wiring pattern 13) and a boundary point between the inner wall part 20b and itself. The both ends of the inner wall part 20b show the shown upper end of the inner wall part 20b (contact point with copper foil 17) and a boundary point between the inner wall part 20a and itself. Therefore, the taper angles in the present embodiment are controlled so as to satisfy Ta (taper angle of inner wall part 20a)<Tb (taper angle of inner wall part 20b). Conversely, when the taper angle is considered in terms of a complementary angle, an inner angle θb (complementary angle of taper angle Tb) formed by the inner wall part 20b and an extended plane of the copper foil 17 is made smaller than an inner angle θa (complementary angle of taper angle Ta) formed by the inner wall part 20a and an extended plane of the wiring pattern 13. In other words, the taper angles satisfy the relation of θa (the above described complementary angle of inner wall part 20a)>θb (the above described complementary angle of inner wall part 20b).

Figure 10:
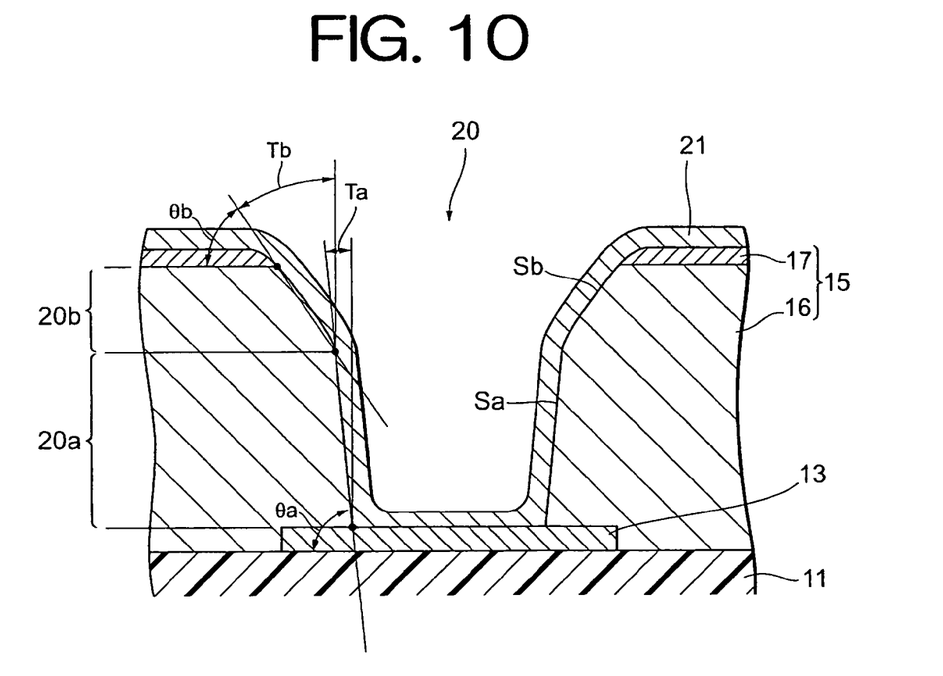
FIG. 10 is a schematic sectional view for schematically illustrating an essential part of a printed wiring board in a state illustrated in FIG. 7.

In addition, a via hole 20 illustrated in FIG. 10 is formed so as to be the same as the via hole 20 illustrated in FIG. 9, except that the wall surface Sb of the inner wall part 20b is formed to have a taper face which curvilinearly and relatively mildly extends in the upper direction in the figure while slightly swelling (so as to form a convex state, conversely, to form a concave state in upper direction in the figure) while widening its diameter. In this embodiment as well, the taper angles are controlled so as to satisfy Ta (taper angle of inner wall part 20a)<Tb (taper angle of inner wall part 20b), and are conversely controlled so as to satisfy θa (inner angle of inner wall part 20a)>θb (inner angle of inner wall part 20b), when a complementary angle is noted.

Figure 11:
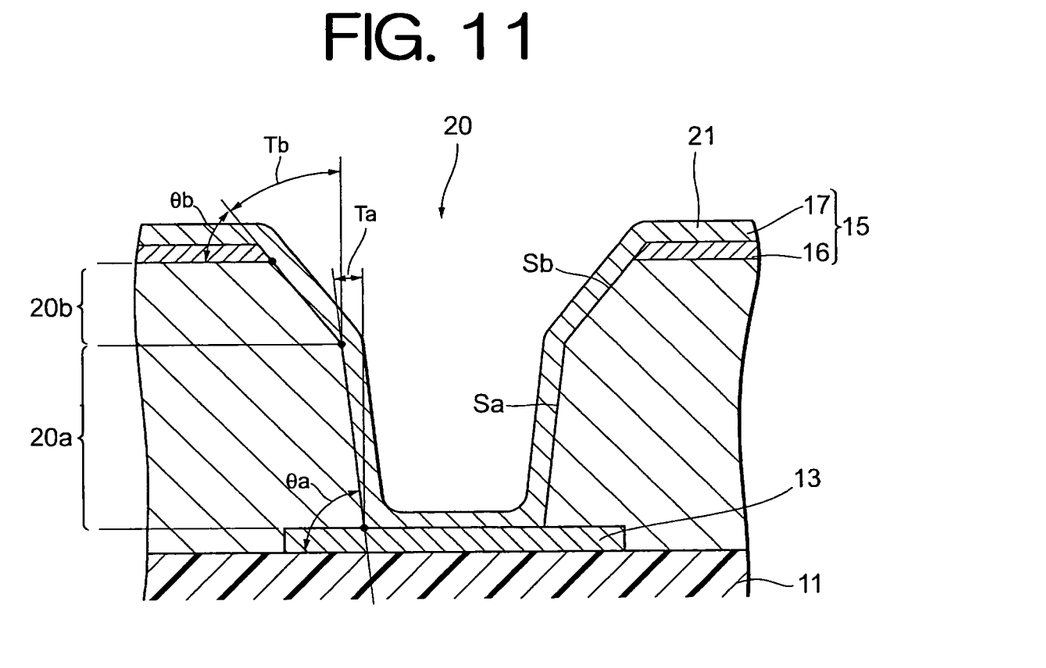
FIG. 11 is a schematic sectional view for schematically illustrating an essential part of a printed wiring board in a state illustrated in FIG. 7.

Furthermore, a via hole 20 illustrated in FIG. 11 is formed so as to be the same as the via hole 20 illustrated in FIG. 9, except that the wall surface Sb of the inner wall part 20b is formed to have a taper face which linearly and relatively mildly extends in the upper direction in the figure while widening its diameter. In this embodiment as well, the taper angles are controlled so as to satisfy Ta (taper angle of inner wall part 20a)<Tb (taper angle of inner wall part 20b), and are conversely controlled so as to satisfy θa (inner angle of inner wall part 20a)>θb (inner angle of inner wall part 20b), when a complementary angle is noted.

Figure 12:
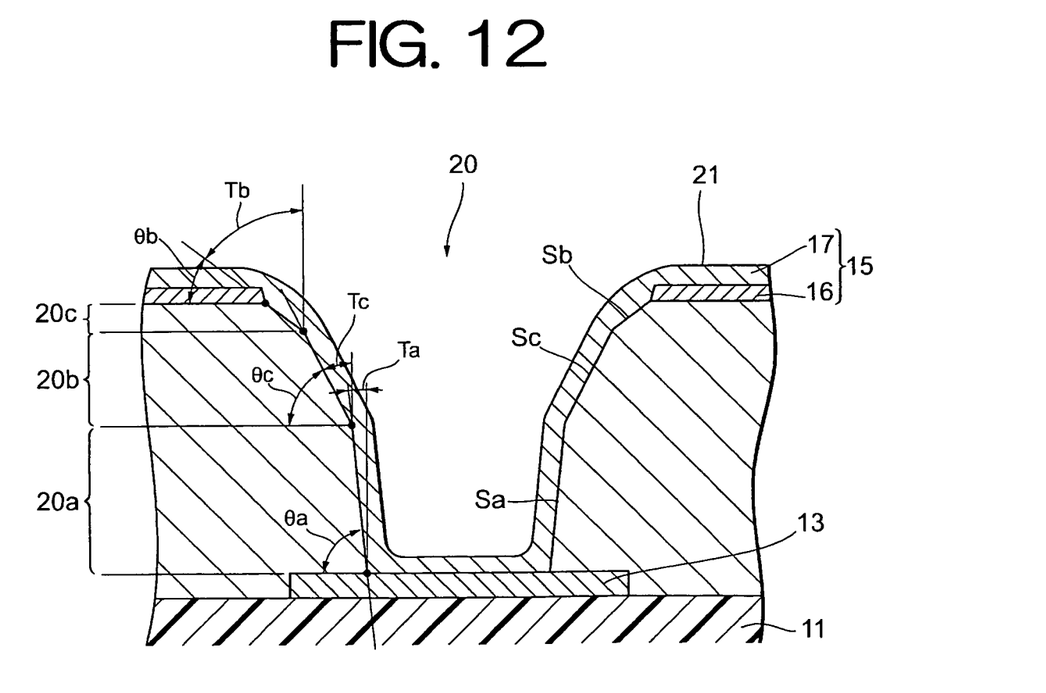
FIG. 12 is a schematic sectional view for schematically illustrating an essential part of a printed wiring board in a state illustrated in FIG. 7.

Still furthermore, a via hole 20 illustrated in FIG. 12 is formed so as to be the same as the via hole 20 illustrated in FIG. 9, except that the wall surface Sb of the inner wall part 20b is formed to have a taper face which linearly and relatively mildly extends in the upper direction in the figure while widening its diameter, and that an inner wall part 20c is provided of which the wall surface Sc is formed to have the taper face that extends linearly and more mildly than the inner wall part 20a but more steeply than the inner wall part 20b in the upper direction in the figure while widening its diameter. In this embodiment, the taper angles are controlled so as to satisfy Ta (taper angle of inner wall part 20a)<Tc (taper angle of inner wall part 20c)<Tb (taper angle of inner wall part 20b), and conversely satisfy θa (inner angle of inner wall part 20a)>θc (inner angle of inner wall part 20c)>θb (inner angle of inner wall part 20b), when a complementary angle is noted.

According to thus configured printed wiring board 100 and the manufacturing method therefor, the method includes connecting a copper foil 17 provided on one side of a thermosetting resin sheet 16 of an insulation layer with a wiring pattern 13 provided on the other side of the thermosetting resin sheet 16 through a via hole 20 which has been formed in the thermosetting resin sheet 16 and has inner wall parts 20a, 20b and (20c). The via hole 20 has a taper angle Tb in a portion contacting with at least the copper foil 17 out of the inner wall part 20b connecting with the copper foil 17 (portion including open end of via hole 20) controlled to be larger than a taper angle Ta of the inner wall part 20a contacting with the wiring pattern 13 positioned in the lower part, and has the gradient in the periphery of the opening of the via hole 20 more mildly decreasing toward the open end than that in the bottom part so as to widen its diameter. Accordingly, when the copper foil 17, the inner part of the via hole 20 and the wiring pattern 13 are plated, the plated film 21 in a portion contacting with at least the copper foil 17 in the periphery of the opening of the via hole 20 can be formed sufficiently thicker than that of a conventional via hole which does not have the inner wall part 20b.

Therefor, the printed wiring board can show an enhanced reliability of connection between the wiring pattern 13 and the copper foil 17, even though the via hole 20 has a higher aspect ratio than that of the conventional via hole. The thickness of the plated film 21 can be previously set at a small value, so that the printed wiring board can sufficiently cope with the trend of finer pitches and the demand for higher packaging density.

In addition, the via hole 20 constituted by a plurality of such inner wall parts 20a, 20b and (20c) having different taper angles can be simply formed in a two-stage process, as is illustrated in FIG. 5 and FIG. 6. At this time, the process does not need to form the hole in the thermosetting resin sheet 16 from above the copper foil 17 simultaneously as in a conventional copper direct method, and as a result, can prevent a burr from forming in the copper foil 17. Furthermore, the process forms the inner wall part 20b of the via hole 20 while chamfering the open end of the hole 19 by blast treatment for the hole 19, so that a blasted medium particle causes impact when colliding with the inner wall surface of the via hole 20. The impact can form fine irregularities on the wall surface Sb of the inner wall part 20b, in particular, and roughen the surface. As a result, the process can enhance the adhesiveness of the plated film 21 to the thermosetting resin sheet 16 through an anchor effect.

FIG. 13 to FIG. 17 are a part of process drawings (flow chart) for showing steps for manufacturing another preferred embodiment of a printed wiring board according to the present invention, which are schematic sectional views for illustrating an essential part of the printed wiring board in each step.

In this embodiment, firstly, a wiring pattern 13 such as an electric wire and a land is formed on a core substrate 11, in the steps similar to those illustrated in FIG. 1 and FIG. 2. At this time, a copper foil 12 in a predetermined region on the core substrate 11 is wholly removed although it is not shown, and a region for mounting electronic components thereon is thereby secured. Subsequently, the electronic components are mounted on the predetermined region. For instance, a semiconductor IC chip is mounted on the predetermined region of the core substrate 11 in a face up state (state in which pad faces to outside of core substrate 11). At this time, it is preferred to temporarily fix the semiconductor IC chip on the core substrate 11 with the use of an adhesive or the like.

Figure 13:
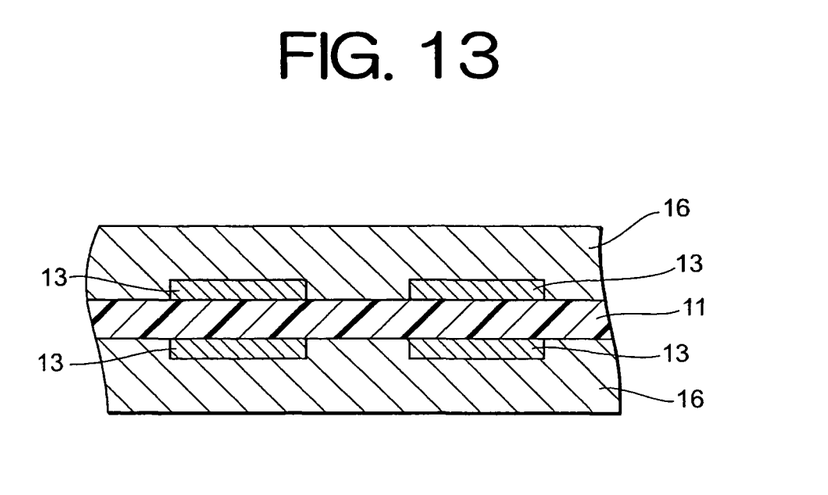
FIG. 13 is a process drawing for showing steps of manufacturing another preferred embodiment of a printed wiring board according to the present invention.

Subsequently, a thermosetting resin sheet 16 is laminated on both sides of the core substrate 11 with a hot press technique or the like (FIG. 13). Thereby, the electronic components such as the semiconductor IC chip, which have been previously mounted on the core substrate 11 are embedded in the printed wiring board, and the thermosetting resin sheet 16 is formed into an insulation layer of a buildup layer.

Figure 14:
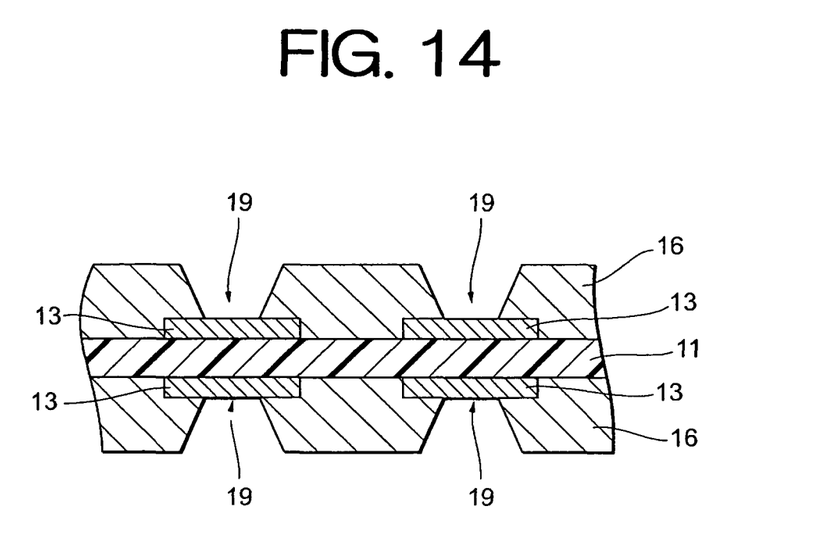
FIG. 14 is a process drawing for showing steps of manufacturing another preferred embodiment of a printed wiring board according to the present invention.
Figure 15:
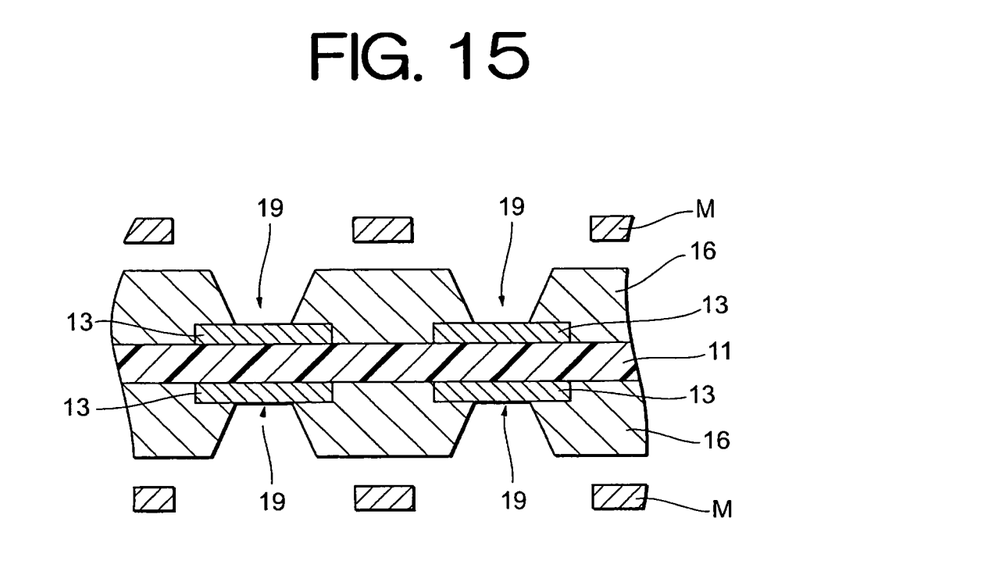
FIG. 15 is a process drawing for showing steps of manufacturing another preferred embodiment of a printed wiring board according to the present invention.
Figure 16:
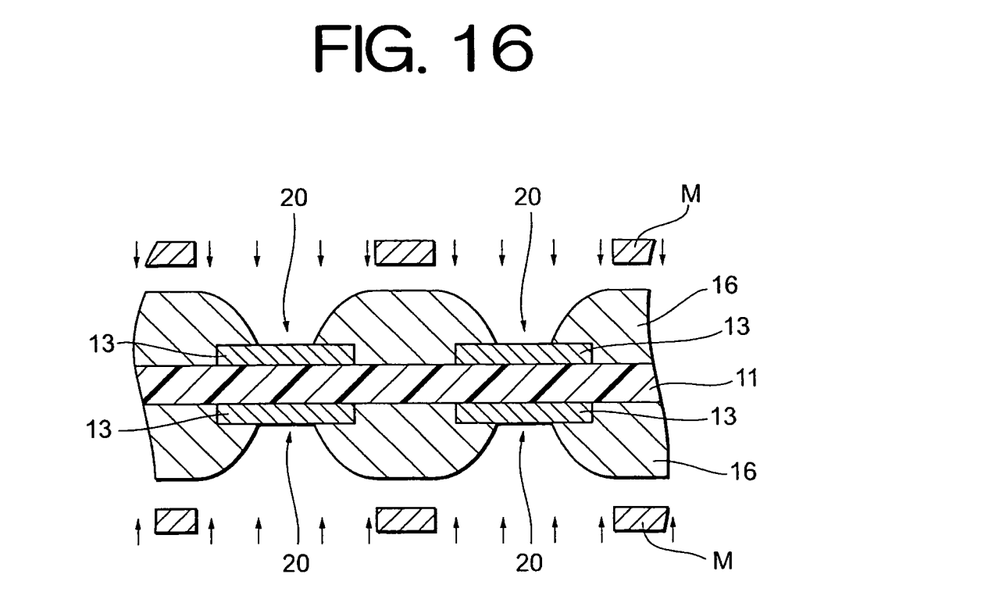
FIG. 16 is a process drawing for showing steps of manufacturing another preferred embodiment of a printed wiring board according to the present invention.
Figure 17:
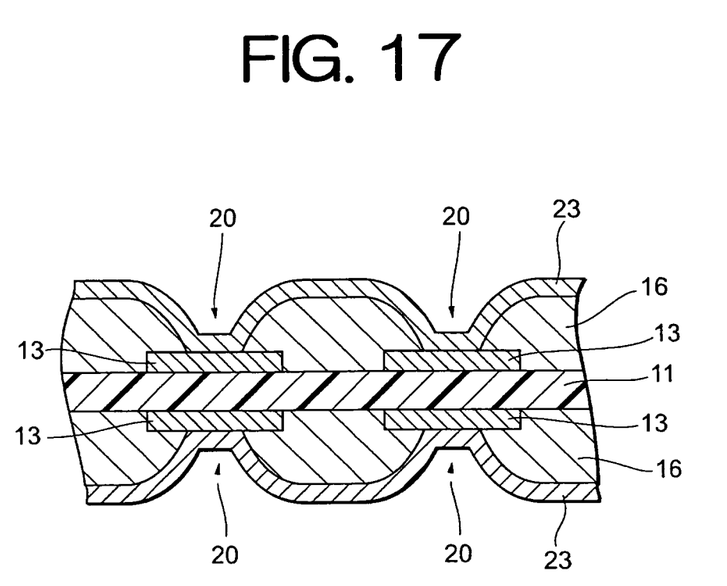
FIG. 17 is a process drawing for showing steps of manufacturing another preferred embodiment of a printed wiring board according to the present invention.

Subsequently, a predetermined position in the thermosetting resin sheet 16 is irradiated with a laser having a predetermined beam diameter, and a hole 19 is formed therein (FIG. 14). An appropriate mask M having an aperture with a larger diameter than that of the hole 19 is placed on the thermosetting resin sheet 16 or right above the thermosetting resin sheet 16 (FIG. 15). The laminate in this state is subjected to blast treatment such as alumina wet blast treatment and sand blast treatment, through which the corner of the open end of the hole 19 is chamfered and a via hole 20 is formed (FIG. 16).

Next, the mask M is removed, and a primary conductor layer (not shown) is formed almost all over the exposed surface including the inner wall surface of the via hole 20 with an electroless plating method. Then, a plated film 23 (including primary conductor layer) is formed almost all over the exposed surface including the inner wall surface in the via hole 20 (FIG. 17), by growing the primary conductor layer with an electrolytic plating method. Subsequently, a conductor pattern similar to the conductor pattern 22 illustrated in FIG. 8 is formed by patterning the plated film 23 through selectively removing the plated film with a photolithographic technology and an etching technique. Thus, the printed wiring board is obtained. Thus, the printed wiring board obtained in the present embodiment does not have the conductor layer 17 in the printed wiring board 100 which has been obtained in the steps illustrated FIG. 1 to FIG. 8, but makes the plated film 23 serve as the conductor layer as well instead. Because of excluding the conductor layer 17, a conductor portion on the thermosetting resin sheet 16 is thinned, and as a result, the height of the printed wiring board can be reduced.

Further another method for manufacturing a printed wiring board according to the present invention may include reversing the order of the steps illustrated in FIG. 4 and FIG. 5, for instance. Specifically, a sheet having no copper foil 17 laminated thereon is employed as the resin sheet 15, and a predetermined position of the thermosetting resin sheet 16 is irradiated with a laser having a predetermined beam diameter to form the hole 19 therein (in other words, the method includes carrying out the steps illustrated in FIG. 1, FIG. 2, FIG. 13 and FIG. 14, in this order). Then, for instance, a resist is patterned on the hole 19 and its circumference of the thermosetting resin sheet 16, a copper film is then formed all over the exposed surface with various deposition methods and plating methods, and the resist is removed. Thereby, a pattern similar to that of the copper foil 17 illustrated in FIG. 5 is formed. In other words, a pattern of the copper foil having a larger aperture diameter than that of the hole 19 is formed. Afterwards, the steps as illustrated in FIG. 6 to FIG. 8 are performed in this order, and the printed wiring board having the same structure as that of the printed wiring board 100 can be obtained.

As was described above, the present invention is not limited to each of the above described embodiments, but changes can be appropriately made in such a range as not to deviate from the outline. For instance, the conductors in the core substrate 11 and the resin sheet 15 are not limited to a copper foil, but may employ another metal layer. Furthermore, the electronic components (embedded element) to be embedded in the printed wiring board 100 are not limited to the above components, but other various electronic components (chip component of single L, C and R, array of L, C and R, LCR multiple chip component with the use of ceramic multilayer substrate, and the like) may be embedded. In this case, the number of a pad electrode of a wiring body which is to be connected with the conductor layer increases along with the increase of the embedded electronic component, the heights of the pad electrodes become various, and the aspect ratios of the via holes become different. Even in such a case, a printed wiring board according to the present invention can prevent the plated film in the periphery of the open end of the via hole from being locally and excessively thin, consequently can enhance the connection reliability, and accordingly can solve various problems relating to the connection reliability due to the increase of the embedded elements, which have been difficult for conventional technologies to cope with.

In addition, the hole 19 may not be formed so as to penetrate the thermosetting resin sheet 16, but may be formed to be a non-through hole having a predetermined depth. Then, the hole 19 is formed through the thermosetting resin sheet 16 to complete the via hole 20, in the step of the following blast treatment or the like, in which the corner of the open end of the hole 19 (edge of aperture) is simultaneously chamfered (in which taper face of inner wall part 20b is formed). Furthermore, the step of forming the hole 19 and the step of forming the via hole 20 are not limited to a laser irradiation process and blast treatment respectively.

A printed wiring board according to the present invention can impart sufficient thickness to a plated film in the periphery of an opening of a through hole when a conductor layer is connected with a wiring layer via the through hole, accordingly can prevent a plating failure in a connection hole such as a via to be formed in the printed wiring board, thereby can enhance the connection reliability in the inner part of the printed wiring board, and can be widely and effectively used as a printed wiring board, a multilayer wiring board and the like which have various electronic components embedded therein, in an equipment, a device, a system and a facility equipped with those, and in manufacture therefor.

The present application is based on Japanese priority application No. 2008-042062 filed on Feb. 22, 2008, the entire contents of which are hereby incorporated by reference.

What is claimed is:

1. A printed wiring board comprising:
an insulation layer having a blind hole;
a conductor layer provided on the insulation layer;
a wiring layer which is electrically connected to the conductor layer via the blind hole; and
a plated film formed within the blind hole which electrically connects the conductor layer with the wiring layer, is provided so as to be exposed from the blind hole, and prevents the wiring layer from being exposed from the blind hole, wherein
the insulation layer has a first inner wall part contacting with the wiring layer and a second inner wall part contacting with the conductor layer,
a second taper angle, measured from a line extending normal to a top surface of the wiring layer to a first part of a portion of the second inner wall part contacting with the conductor layer is larger than a first taper angle measured from the line extending normal to the top surface of the wiring layer to the first inner wall part, and
a second part of the portion of the second inner wall part contacting with the conductor layer forms a concave surface in a direction towards the blind hole.

2. A printed wiring board comprising:
an insulation layer having a blind hole;
a conductor layer provided on the insulation layer;
a wiring layer which is electrically connected to the conductor layer via the blind hole; and
a plated film formed within the blind hole which electrically connects the conductor layer with the wiring layer, is provided so as to be exposed from the blind hole, and prevents the wiring layer from being exposed from the blind hole, wherein
the insulation layer has a first inner wall part contacting with the wiring layer and a second inner wall part contacting with the conductor layer,
a second inner angle measured from a plane extending along a top surface of the wiring layer to a first part of a portion of the second inner wall part is smaller than a first inner angle measured from the plane extending along the top surface of the wiring layer to the first inner wall part, and
a second part of the portion of the second inner wall part contacting with the conductor layer forms a concave surface in a direction towards the blind hole.

3. A printed wiring board comprising:
an insulation layer having a blind hole;
a conductor layer provided on the insulation layer;
a wiring layer which is electrically connected to the conductor layer via the blind hole; and
a plated film formed within the blind hole which electrically connects the conductor layer with the wiring layer, is provided so as to be exposed from the blind hole, and prevents the wiring layer from being exposed from the blind hole, wherein
the insulation layer has a first inner wall part contacting with the wiring layer and a second inner wall part contacting with the conductor layer and extending linearly away from the first inner wall part,
a second taper angle, measured from a line extending normal to a top surface of the wiring layer to a first part of a portion of the second inner wall part contacting with the conductor layer is larger than a first taper angle measured from the line extending normal to the top surface of the wiring layer to the first inner wall part, and
a second part of the portion of the second inner wall part contacting with the conductor layer forms a concave surface in a direction towards the blind hole.

4. The printed wiring board of claim 3, wherein the insulation layer further comprises a third inner wall part contacting with the conductor layer and extending curvilinearly away from the second inner wall part.

5. A printed wiring board comprising:
an insulation layer having a blind hole;
a conductor layer provided on the insulation layer;
a wiring layer which is electrically connected to the conductor layer via the blind hole; and
a plated film formed within the blind hole which electrically connects the conductor layer with the wiring layer, is provided so as to be exposed from the blind hole, and prevents the wiring layer from being exposed from the blind hole, wherein
the insulation layer has a first inner wall part contacting with the wiring layer and a second inner wall part contacting with the conductor layer and extending linearly away from the first inner wall part,
a second inner angle measured from a plane extending along a top surface of the wiring layer to a first part of a portion of the second inner wall part is smaller than a first inner angle measured from the plane extending along the top surface of the wiring layer to the first inner wall part, and
a second part of the portion of the second inner wall part contacting with the conductor layer forms a concave surface in a direction towards the blind hole.

6. The printed wiring board of claim 5, wherein the insulation layer further comprises a third inner wall part contacting with the conductor layer and extending curvilinearly away from the second inner wall part.

* * * * *